US008546247B2

(12) United States Patent
Fukutome et al.

(10) Patent No.: US 8,546,247 B2
(45) Date of Patent: Oct. 1, 2013

(54) MANUFACTURING METHOD OF SEMICONDUCTOR DEVICE WITH AMORPHOUS SILICON LAYER FORMATION

(75) Inventors: Hidenobu Fukutome, Kawasaki (JP); Youichi Momiyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 234 days.

(21) Appl. No.: 12/364,211

(22) Filed: Feb. 2, 2009

(65) Prior Publication Data

US 2009/0227085 A1 Sep. 10, 2009

Related U.S. Application Data

(63) Continuation of application No. 11/760,907, filed on Jun. 11, 2007, now abandoned.

(30) Foreign Application Priority Data

Jun. 14, 2006 (JP) ................................ 2006-165225

(51) Int. Cl.
*H01L 21/20* (2006.01)
*H01L 21/36* (2006.01)

(52) U.S. Cl.
USPC ........... 438/486; 438/478; 438/482; 438/492; 438/495; 257/E21.16; 257/E21.19; 257/E21.34; 257/E21.44; 257/E21.47

(58) Field of Classification Search
USPC ................. 438/199, 478, 482, 486, 492, 495; 257/E21.16, E21.19, E21.34, E21.44, E21.47
See application file for complete search history.

(56) References Cited

U.S. PATENT DOCUMENTS

| | | | | |
|---|---|---|---|---|
| 4,479,831 | A * | 10/1984 | Sandow et al. | 438/301 |
| 5,053,848 | A * | 10/1991 | Houston et al. | 257/537 |
| 5,618,760 | A * | 4/1997 | Soh et al. | 438/703 |
| 5,652,156 | A * | 7/1997 | Liao et al. | 438/161 |
| 5,729,035 | A * | 3/1998 | Anma | 257/324 |
| 5,893,721 | A * | 4/1999 | Huang et al. | 438/34 |
| 5,972,761 | A * | 10/1999 | Wu | 438/305 |
| 5,998,284 | A | 12/1999 | Azuma | |
| 6,000,947 | A * | 12/1999 | Minne et al. | 438/759 |
| 6,063,698 | A * | 5/2000 | Tseng et al. | 438/585 |
| 6,100,204 | A * | 8/2000 | Gardner et al. | 438/765 |

(Continued)

FOREIGN PATENT DOCUMENTS

| | | | |
|---|---|---|---|
| JP | 9-320990 | A | 12/1997 |
| JP | 2000-031475 | A | 1/2000 |

(Continued)

OTHER PUBLICATIONS

Japanese Office Action dated Mar. 6, 2012, issued in corresponding Japanese Patent Application No. 2006-165225, with English translation (7 pages).

*Primary Examiner* — Thao Le
*Assistant Examiner* — Eric Jones
(74) *Attorney, Agent, or Firm* — Westerman, Hattori, Daniels & Adrian, LLP

(57) ABSTRACT

A method of manufacturing a semiconductor device, in which an amorphous silicon layer is formed into a shape of a gate electrode of a MOS transistor, and then impurity is implanted to a surface of a silicon substrate from a diagonal direction using the amorphous silicon layer as a mask.

9 Claims, 18 Drawing Sheets

(56) References Cited

U.S. PATENT DOCUMENTS

| | | | | |
|---|---|---|---|---|
| 6,103,582 | A * | 8/2000 | Lee et al. | 438/299 |
| 6,162,716 | A * | 12/2000 | Yu et al. | 438/592 |
| 6,294,442 | B1 * | 9/2001 | Kamal | 438/486 |
| 6,365,476 | B1 * | 4/2002 | Talwar et al. | 438/308 |
| 6,432,763 | B1 * | 8/2002 | Yu | 438/217 |
| 6,545,328 | B1 * | 4/2003 | Morosawa et al. | 257/413 |
| 6,632,729 | B1 * | 10/2003 | Paton | 438/535 |
| 6,686,245 | B1 * | 2/2004 | Mathew et al. | 438/283 |
| 6,730,976 | B2 * | 5/2004 | Harada et al. | 257/408 |
| 6,884,672 | B1 * | 4/2005 | Balasubramanyam et al. | 438/231 |
| 6,916,694 | B2 * | 7/2005 | Hanafi et al. | 438/166 |
| 6,977,417 | B2 * | 12/2005 | Momiyama et al. | 257/336 |
| 7,067,382 | B2 | 6/2006 | Nakaoka et al. | |
| 7,214,972 | B2 * | 5/2007 | Hanafi et al. | 257/190 |
| 2001/0003378 | A1 * | 6/2001 | Harada et al. | 257/726 |
| 2001/0015465 | A1 * | 8/2001 | Lee et al. | 257/394 |
| 2003/0098486 | A1 * | 5/2003 | Sambonsugi et al. | 257/371 |
| 2004/0004250 | A1 * | 1/2004 | Momiyama et al. | 257/336 |
| 2004/0087094 | A1 * | 5/2004 | Wristers et al. | 438/302 |
| 2004/0130020 | A1 * | 7/2004 | Kuwabara et al. | 257/723 |
| 2004/0155288 | A1 | 8/2004 | Noda | |
| 2005/0136583 | A1 * | 6/2005 | Chen et al. | 438/199 |
| 2005/0196926 | A1 * | 9/2005 | Hanafi et al. | 438/287 |
| 2005/0236667 | A1 * | 10/2005 | Goto et al. | 257/344 |
| 2005/0260862 | A1 * | 11/2005 | Komatsu et al. | 438/762 |
| 2005/0269634 | A1 * | 12/2005 | Bojarczuk et al. | 257/338 |
| 2006/0121651 | A1 * | 6/2006 | Park et al. | 438/149 |
| 2006/0275977 | A1 * | 12/2006 | Bojarczuk et al. | 438/216 |
| 2007/0238234 | A1 * | 10/2007 | Wang et al. | 438/197 |
| 2008/0064191 | A1 * | 3/2008 | Teo et al. | 438/530 |
| 2009/0011610 | A1 * | 1/2009 | Bojarczuk et al. | 438/763 |
| 2011/0097883 | A1 * | 4/2011 | Euen et al. | 438/585 |

FOREIGN PATENT DOCUMENTS

| | | | |
|---|---|---|---|
| JP | 2002-083819 | A | 3/2002 |
| JP | 2004235603 | A | 8/2004 |
| JP | 2004-356431 | A | 12/2004 |

* cited by examiner (A)

(B)

nMOS region pMOS region (A)

(B)

(C)

(D)

(E)

(F)

MANUFACTURING METHOD OF SEMICONDUCTOR DEVICE WITH AMORPHOUS SILICON LAYER FORMATION

CROSS-REFERENCE TO RELATED APPLICATIONS

This application is a continuation of U.S. patent application Ser. No. 11/760,907 filed Jun. 11, 2007, which is based upon and claims the benefit of priority from the prior Japanese Patent Application No. 2006-165225, filed on Jun. 14, 2006, the entire contents of which are incorporated herein by reference.

FIELD OF THE INVENTION

The present invention relates to the manufacturing of a MOS transistor formed on a semiconductor substrate.

BACKGROUND OF THE INVENTION

In recent years, scaling down in size of MOS transistors has been continuing in accordance with the scaling rule in order to reduce power consumption and improve the operation rate of semiconductor integrated circuit, and moreover suppress manufacturing cost by improving integration density. However, as gate length of a MOS transistor becomes short, a punch-through current flows between the source and the drain even if the transistor is in the off state. The consequence is the so-called "short-channel effect" which causes various problems in the semiconductor integrated circuit.

As an effective means for preventing short-channel effect, formation of a pocket region may be considered. A pocket region is a region formed so as to extrude under the gate from the gate edge of the MOS transistor by implanting an impurity of the same conductivity type as the channel region in high concentration, and this pocket region is provided for suppressing spread of depletion layer at the drain edge.

The pocket region is generally formed as follows. A gate insulating film is formed on a silicon substrate and a polycrystal silicon layer is deposited on the gate insulating film as a gate electrode. Next, after a gate pattern is formed by processing the polycrystal silicon layer, an impurity of the same conductivity type as that of a channel impurity is implanted to the silicon substrate using the gate pattern as a mask. The pocket impurity is generally implanted from a diagonal direction to the substrate surface in view of implanting the impurity to the lower side of the gate pattern. Thereafter, high temperature annealing is performed to activate the impurity.

FIGS. 1(A) and 1(B) are graphs showing the relationship between threshold voltage value (Vth) and gate length of common MOS transistors. FIG. 1(A) shows the characteristic of a nMOS transistor and FIG. 1(B), the characteristic of a pMOS transistor. The vertical axis indicates Vth (V) and the horizontal axis indicates gate length (nm). As demonstrated by these graphs, when the gate length becomes 70 nm or less, both nMOS transistor and pMOS transistor have reduced absolute values of Vth; and subsequently, short-channel effect appears.

FIG. 2 is a graph indicating gate leakage current and overlap capacitance when the MOS transistor manufactured on the basis of the related art is in the off state. The vertical axis indicates leakage current (A/μm) and the horizontal axis indicates overlap capacitance (fF/μm). In this figure, ∇ is the data when Sb is implanted as a pocket impurity, while Δ is the data when B is implanted, ○ is the data when P is implanted, and □ is the data when In is implanted, respectively. Here, the overlap capacitance means the accumulated capacity of the capacitor formed by the gate insulating film, a gate electrode and an extension region. The extension region is a diffusing region formed by shallow implantation of an impurity of the conductivity type opposite to that of the channel region into the surface of a silicon substrate located under the gate pattern edge.

On the surface of silicon substrate under the gate edge, both pocket impurity and extension impurity exist and these impurities cancel each other, as the impurities have opposite conductivity types.

An object of the present invention is to improve important characteristics of a MOS transistor by improving the processes to form the pocket region.

SUMMARY OF THE INVENTION

The present invention relates to a manufacturing method of a semiconductor device comprising the steps of depositing an amorphous silicon layer on a gate insulating layer, forming a gate pattern of a MOS transistor, and implanting impurity from a diagonal direction to the surface of the semiconductor substrate using the amorphous silicon layer of the gate pattern as a mask.

DETAILED DESCRIPTION OF THE INVENTION

In the present invention, amorphous silicon is used as a gate electrode, because of this characteristic, impurity implanted to the side wall of the gate pattern in the pocket impurity implanting process does not randomly generate channeling and thereby fluctuations in the pocket region can be suppressed.

First Embodiment

Figure 1:
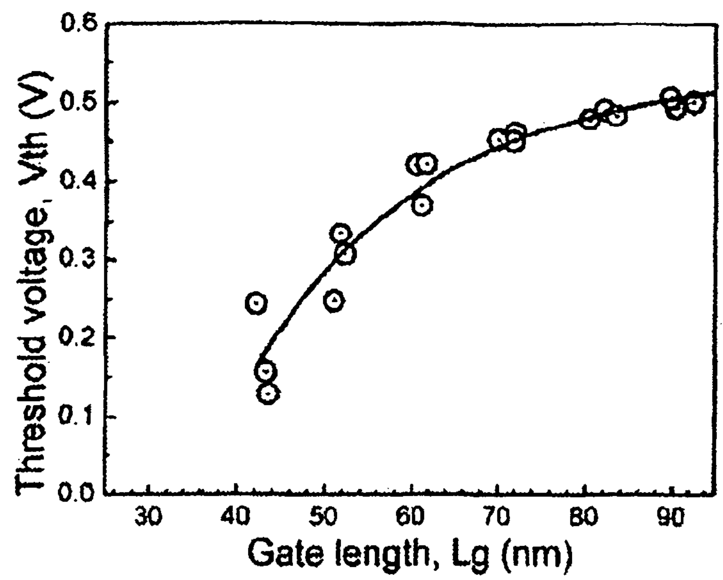
FIGS. 1(A) and (B) are graphs showing the relationship between the threshold voltage value (Vth) and gate length of a MOS transistor.
Figure 1:
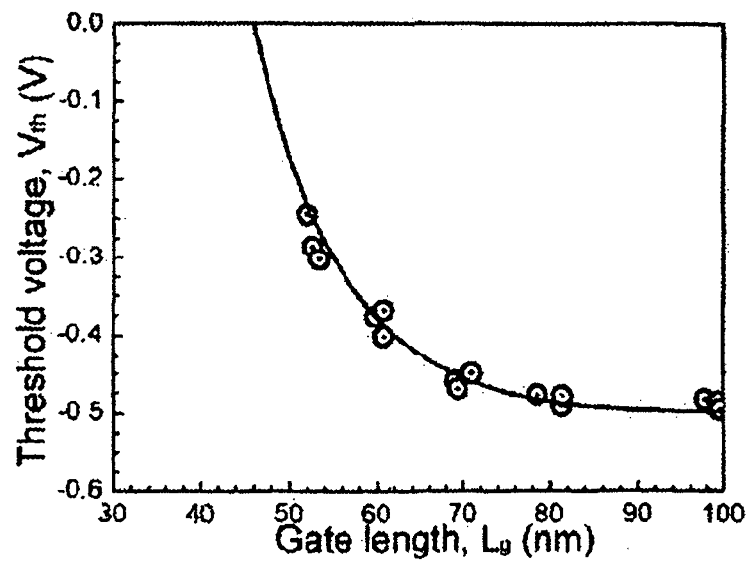
Figure 2:
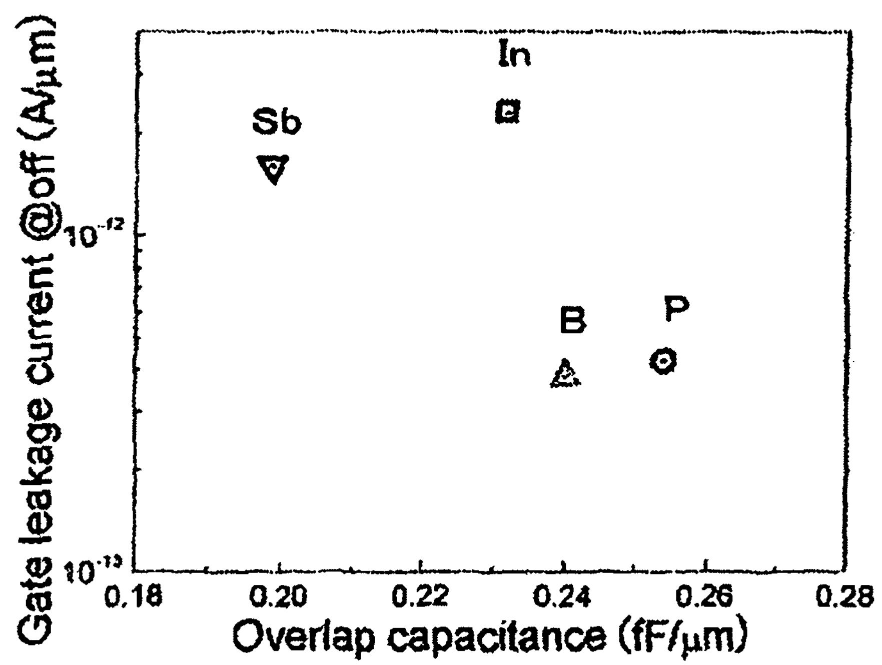
FIG. 2 is a graph showing gate leakage current and overlap capacitance in the off state of the MOS transistor.
Figure 3:
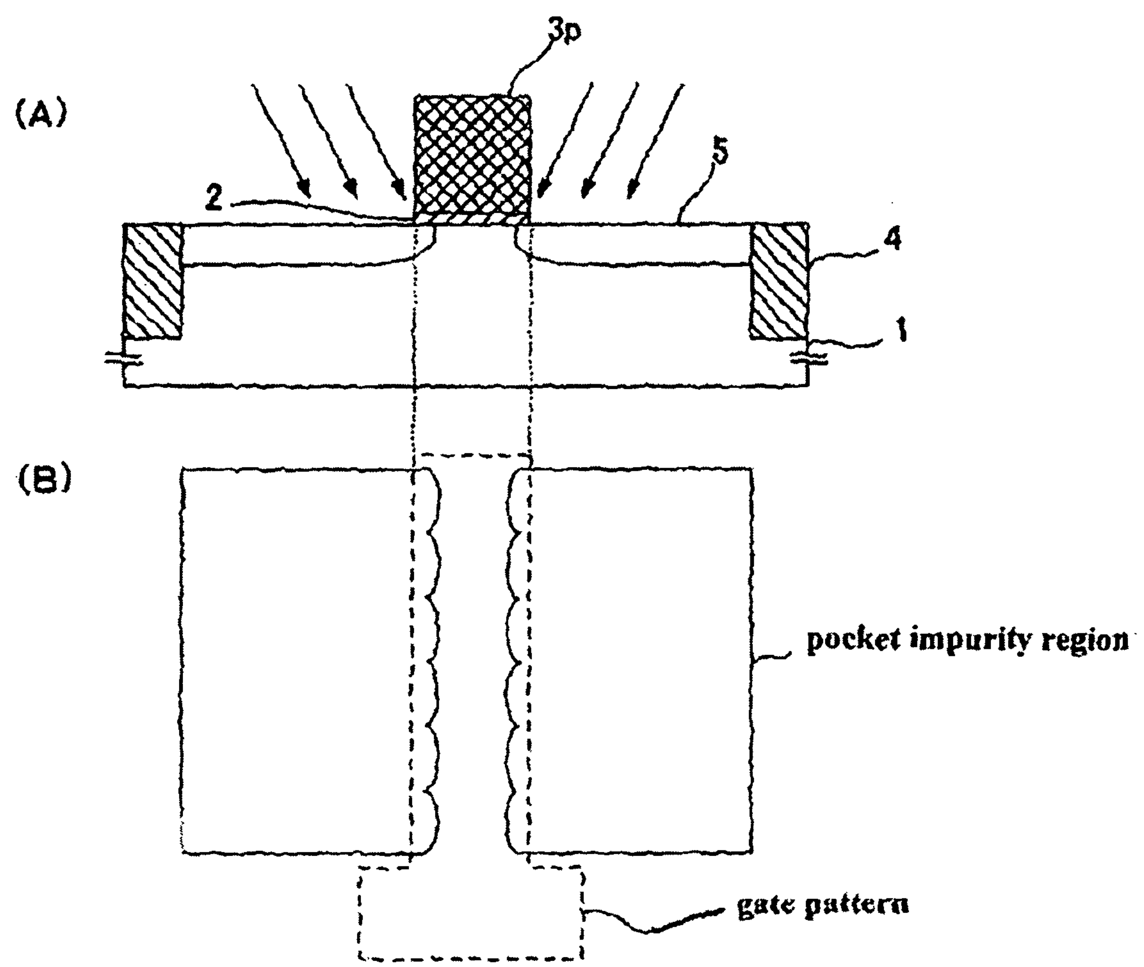
FIGS. 3(A) and (B) are diagrams for explaining the structure of a pocket region of the MOS transistor.

FIG. 3 is a diagram for explaining a pocket region of a MOS transistor. FIGS. 3(A) and 3(B) are a cross-sectional view and a plan view of MOS transistor, respectively. First, a gate insulating film 2 and a polycrystal silicon gate pattern 3*p* are formed on a silicon substrate 1. Next, pocket impurity is implanted from a diagonal direction to the surface of the silicon substrate 1. During this implantation step a part of the pocket impurity implanted to a side wall of the polycrystal silicon gate pattern 3*p* moves for a long distance within the polycrystal silicon layer 3*p* along the crystal lattice, based upon the phenomenon called "channeling," and finally the impurity reaches a channel region under the gate pattern. Since the polycrystal silicon is constituted with a plurality of crystal grains which are different respectively in crystal orientation, distance in which impurity moves due to the channeling is not equal throughout the implantation region. As a result, fluctuation as shown in FIG. 3(B) is generated in a profile of the pocket region 5 formed on the silicon substrate 1 under the gate pattern. As illustrated in FIG. 3(B), fluctuation has a constant period, but such fluctuation is often generated randomly resulting from grain size and crystal orientation of polycrystal silicon.

Figure 4:
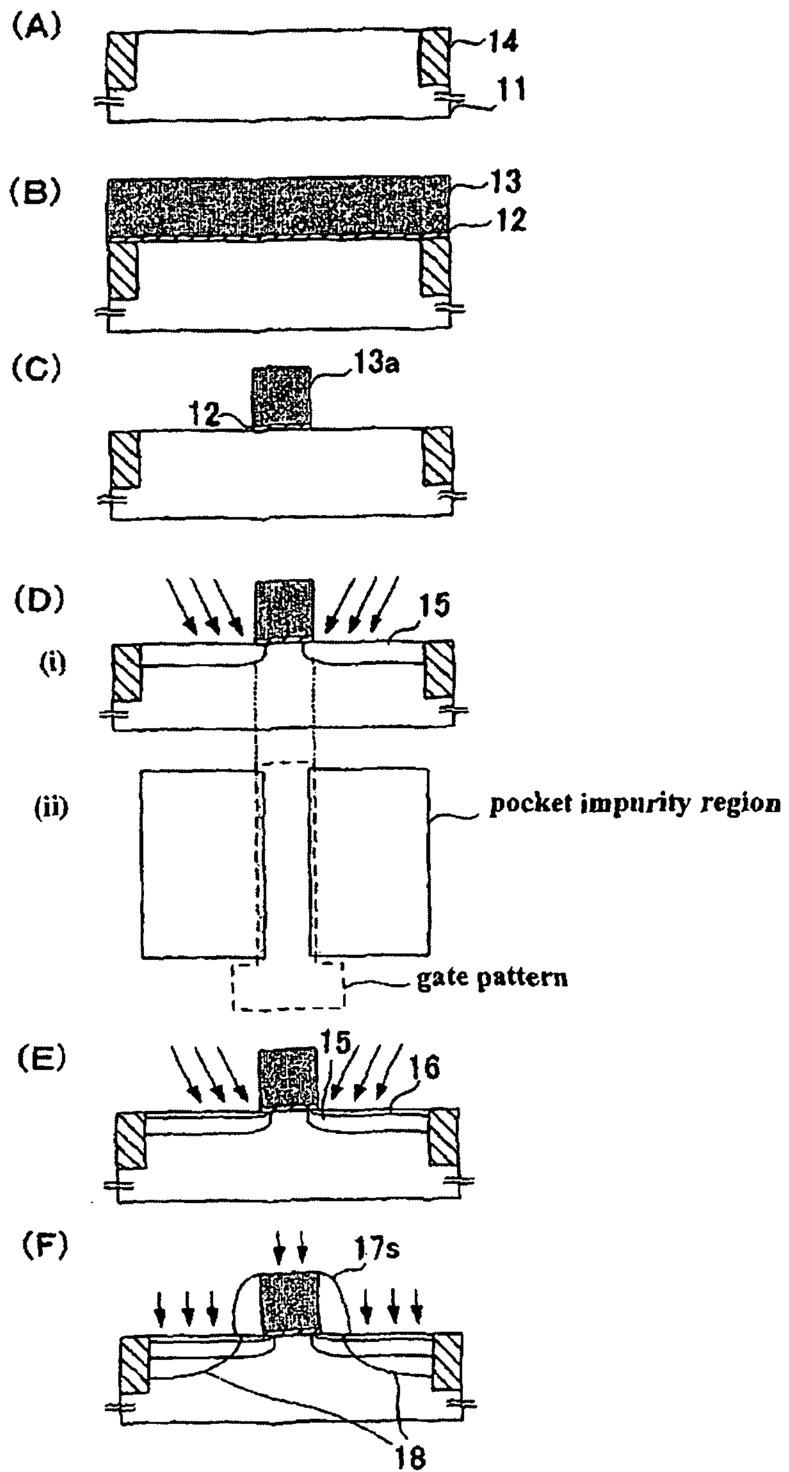
FIG. 4(A)-(F) are cross-sectional views of processes to manufacture an nMOS transistor according to the first embodiment of the present invention.

FIGS. 4(A) to 4(F) are cross-sectional views of processes for manufacturing an nMOS transistor according to the first embodiment. First, as shown in FIG. 4(A), an element isolating region 14 is formed on a silicon substrate (semiconductor substrate) 11 with the STI (Shallow Trench Isolation) method. Other methods for element isolation, such as, the LOCOS (Local Oxidation of Silicon) method may also be used.

Next, as shown in FIG. 4(B), a gate insulating film 12 is formed on an active region isolated by the element isolating region 14. For example, using the thermal oxidation method, a silicon oxide film is formed on the surface of the silicon substrate 11 in the thickness of 2 nm. The gate insulating film is not limited to such a silicon oxide film, a silicon nitride film, a stacked structure of silicon oxide film and silicon nitride film, or a high dielectric material film such as HfO2 may also be used. Next, an amorphous silicon layer 13 is deposited on the gate insulating film 12. For example, the amorphous silicon is deposited in the thickness of 100 nm with the CVD method. The thicknesses and forming methods of the gate insulating film 12 and amorphous silicon layer 13 are not limited to those disclosed for this embodiment and other suitable alternatives known to those in the art may be employed.

Next, as shown in FIG. 4(C), the gate insulating film 12 and amorphous silicon layer 13 are formed into gate patterns. The gate length of a nMOS transistor is set to about 40 nm to 90 nm, while gate length of a pMOS transistor is set to about 50 to 100 nm.

Next, as shown in FIG. 4(D)(i), an impurity of the conductivity type same as that of the channel region is implanted into the silicon substrate 11 using the amorphous silicon layer 13*a* of the gate pattern as a mask to thereby form a pocket region 15. Here, since the nMOS transistor is explained as an example, ion implantation of impurities such as B and In is executed. As the ion implantation conditions of In, the acceleration energy is set to 20 keV to 150 keV, an amount of single dose is set to $1\times10^{12}$/cm2 to $2\times10^{13}$/cm2 and ion implantation is executed from four directions with a certain inclination from the vertical direction to the surface of semiconductor substrate 11. This inclination angle is preferably set to 7° to 45° with the direction perpendicular to the substrate surface defined as 0°. Generation of channeling of impurity implanted to the silicon substrate 11 may be prevented by setting the inclination angle to 7° or more. In addition, the inclination angle is also set to 45° or less to prevent inadequate impurity implantation to the pocket implantation region based on any adjacent elements which may interfere with implantation. Moreover, as the conditions for implanting B ion, acceleration energy is set to 5 keV to 30 keV, amount of single dose is set to $1\times10^{12}$/cm2 to $2\times10^{13}$/cm2 and ion implantation is conducted from four directions with the inclination angles of 7° to 45°.

A plan view of FIG. 4(D) (ii) shows the region where pocket impurity is implanted. Since the amorphous silicon gate layer 13*a* of gate pattern functions as a mask, impurity forms the pocket region in the shape where the impurity diffuses a little to the area under the gate from both edges of gate. In comparison with FIG. 3(B) explained as the related art, an edge of the region where impurity is implanted shows a linear profile which is equal in distance from the edges of gate.

Next, as shown in FIG. 4(E), ion implantation is executed to form an extension region 16. As, P, and Sb are commonly used extension impurities for the nMOS transistor. As the conditions for extension ion implantation when As is used, for example, acceleration energy is set to 0.5 keV to 5 keV, inclination angle is set to 0° to 10° and amount of single dose is set to $1\times10^{14}$/cm2 to $3\times10^{15}$/cm2. As the conditions for ion implantation of P, for example, acceleration energy is set to 2 keV to 3 keV, total amount of dose is set to $1\times10^{14}$/cm2 to $2\times10^{14}$/cm2 and inclination angle is set to 0° to 10°.

Finally, as shown in FIG. 4(F), a side wall spacer 17*s* is formed, if necessary, on the side wall of the gate pattern and the source/drain impurity implantation is conducted to form the source/drain region 18. Here, since the nMOS transistor is explained as an example, an n-type impurity such as P and As is ion-implanted.

FIG. 4(A)-(F) are provided for explaining the manufacturing process of the nMOS transistor. However, this embodiment can also be adapted to the manufacturing process of pMOS transistor.

Figure 5:
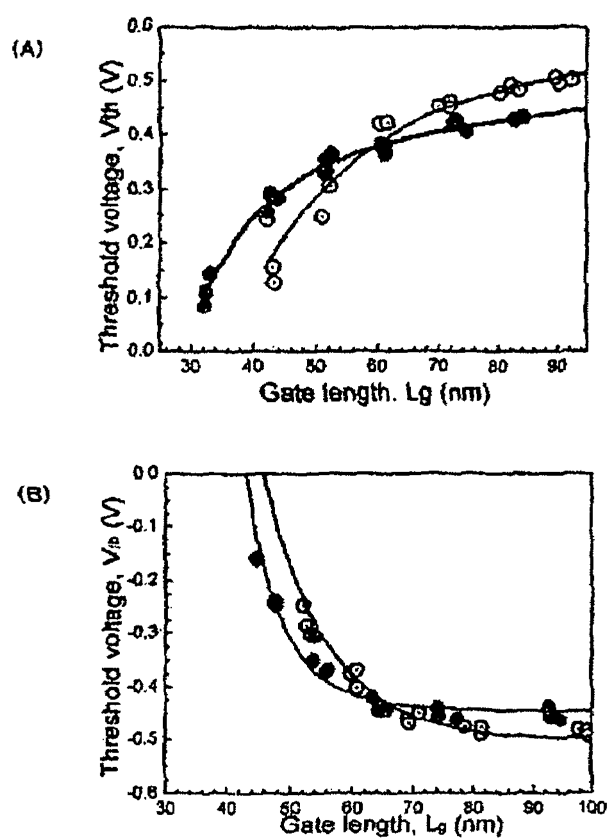
FIGS. 5(A) and (B) are graphs showing the relationships between Vth and gate length of the MOS transistor manufactured on the basis of the first embodiment of the present invention in comparison with these characteristics from the related art.

FIGS. 5(A) and 5(B) are graphs indicating for comparison of the relationship between Vth and gate length of the MOS transistor manufactured on the basis of this embodiment with the characteristics of MOS transistor using a polycrystal silicon as the gate electrode. FIG. 5(A) is the characteristic of the nMOS transistor, while FIG. 5(B) is the characteristic of the pMOS transistor. In the figures, ○ indicates the data of the related art, while ●, the data of this embodiment. The vertical axis indicates Vth (V) and the horizontal axis, the gate length (nm). According to FIGS. 5(A) and 5(B), it can be understood, in the case where amorphous silicon is uses as the gate electrode, that the gate length value wherein the absolute value of Vth starts to be reduced becomes smaller than that of the device using a polycrystal silicon as the gate electrode. In this case, the assumed reasons for the above described improved results is that since fluctuation in the pocket region is suppressed by using amorphous silicon as the gate electrode the function of the pocket region as the measure for short-channel effect is improved.

Figure 6:
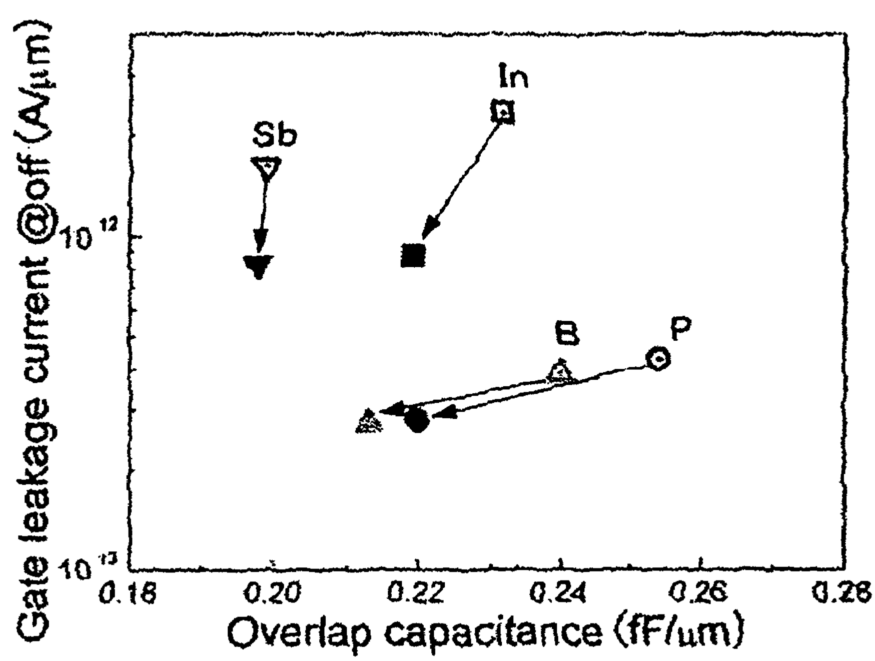
FIG. 6 is a graph showing gate leakage current and overlap capacitance of the MOS transistor manufactured on the basis of the first embodiment of the present invention in comparison with these characteristics of the related art.

FIG. 6 is a graph of gate leakage current and overlap capacitance of the MOS transistor manufactured based on the first embodiment in comparison with the characteristics of the MOS transistor using a polycrystal silicon as the gate electrode. In this figure, ∇, Δ, ○, and □ respectively indicate the data of the related art obtained by respectively implanting Sb, B, P, and In as the pocket impurity, while ▼, ▲, ●, and ■ respectively indicate the data of the first embodiment obtained by respectively implanting Sb, B, P, and In as the pocket impurity. The vertical axis indicates gate leakage current (A/μm) and the horizontal axis, overlap capacitance (fF/μm).

According to FIG. 6, it can be understood that when the amorphous silicon gate electrode is used, overlap capacitance is reduced in comparison with that when the polycrystal silicon gate electrode is used. In more concrete terms, when B is used as the pocket impurity, the overlap capacitance is reduced by 13%; when P is used, reduced by 12%; when In is used, reduced by 5%; and when Sb is used, reduced by 1%. Moreover, with reduction in the overlap capacitance, the gate leakage current is also reduced.

Reason can be found in that fluctuation of pocket region is suppressed with the first embodiment.

FIGS. 7(A) to 7(D) are cross-sectional views showing the processes for siliciding the gate electrode in the first embodiment. These processes are conducted after the process of FIG. 4(F) as required.

Figure 7:
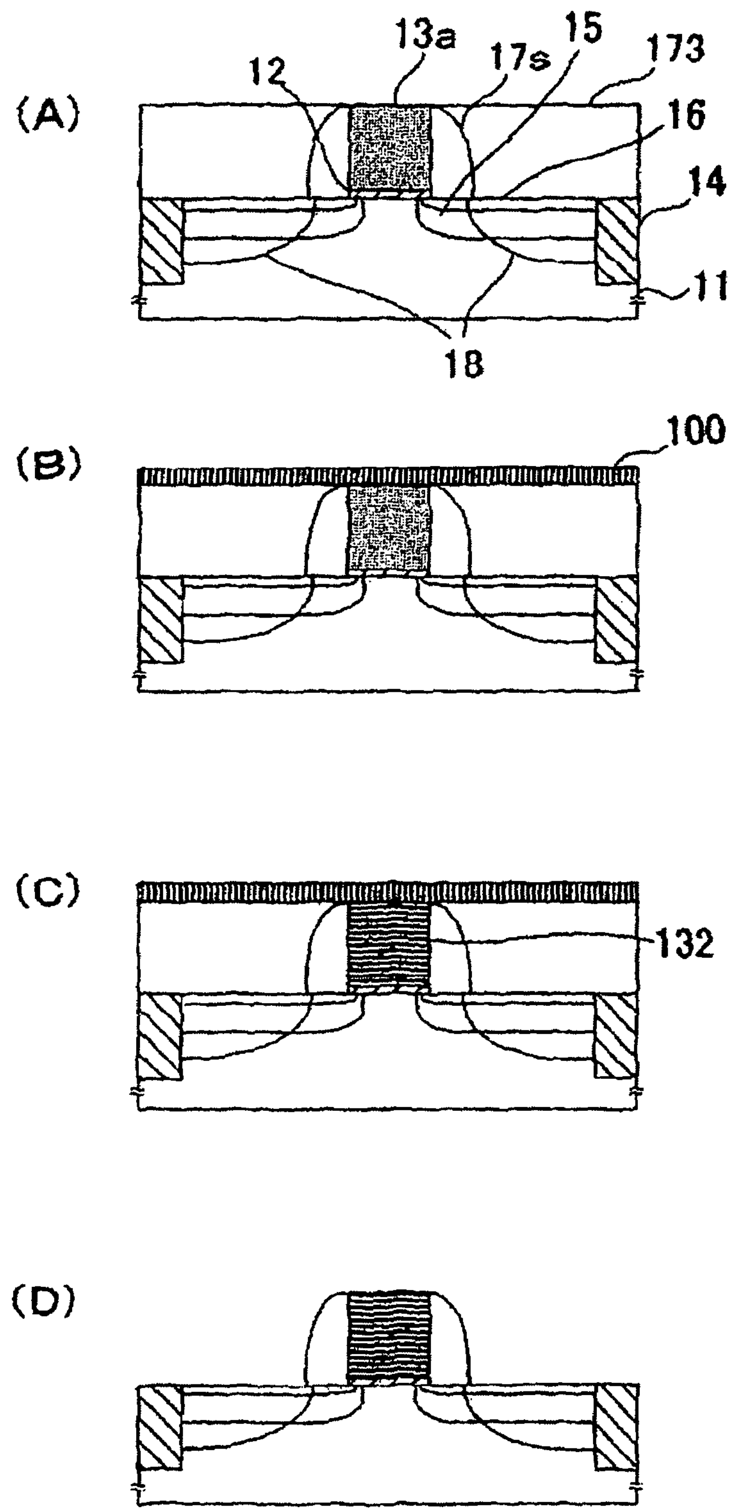
FIG. 7(A)-(D) are cross-sectional views showing the silicide process of a gate pattern in the first embodiment.

First, as shown in FIG. 7(A), an insulating film 173 is deposited on the entire region and the upper surface of the amorphous silicon gate electrode 13*a* is exposed with the CMP (Chemical Mechanical Polishing) process.

Next, as shown in FIG. 7(B), a metal layer 100 such as Ni and Co or the like is deposited on the amorphous silicon gate pattern 13*a*.

Next, a metal silicide electrode 132 is formed through reaction between the metal layer 100 and the amorphous silicon gate pattern 13*a* by conducting an annealing process.

As shown in FIG. 7(D), non-reacted remnant of the metal layer 100 is removed and thereafter the insulating film 173 is also removed. With the processes explained above, the gate electrode is formed as an electrode having lower resistance and thereby the MOS transistor realizes high-speed operation.

This embodiment is effective not only for the process to form the pocket region but also for the process to execute extension implantation from a diagonal direction to the surface of substrate. Even in this case, fluctuation of the implantation region of extension impurity can also be prevented by suppressing channeling within the gate pattern of the extension impurity implanted from the side surface of gate pattern.

Second Embodiment

First Example

In the process of FIG. 4(F), impurity is implanted also into the amorphous silicon gate pattern 13*a* simultaneously with impurity implantation to form the source/drain region in the silicon substrate 11. Here, when the gate pattern is in the amorphous state, the impurity implanted from the upper surface of the gate pattern stays at an upper surface region without generation of channeling. Accordingly, a depletion layer is generated in the gate pattern above the gate insulating film, and the effective gate insulating film thickness increases, thereby interfering with the high-speed operation of the MOS transistor.

FIGS. 8(A) to 8(E) are cross-sectional views of processes performed to manufacture a nMOS transistor in the first example of the second embodiment.

Figure 8:
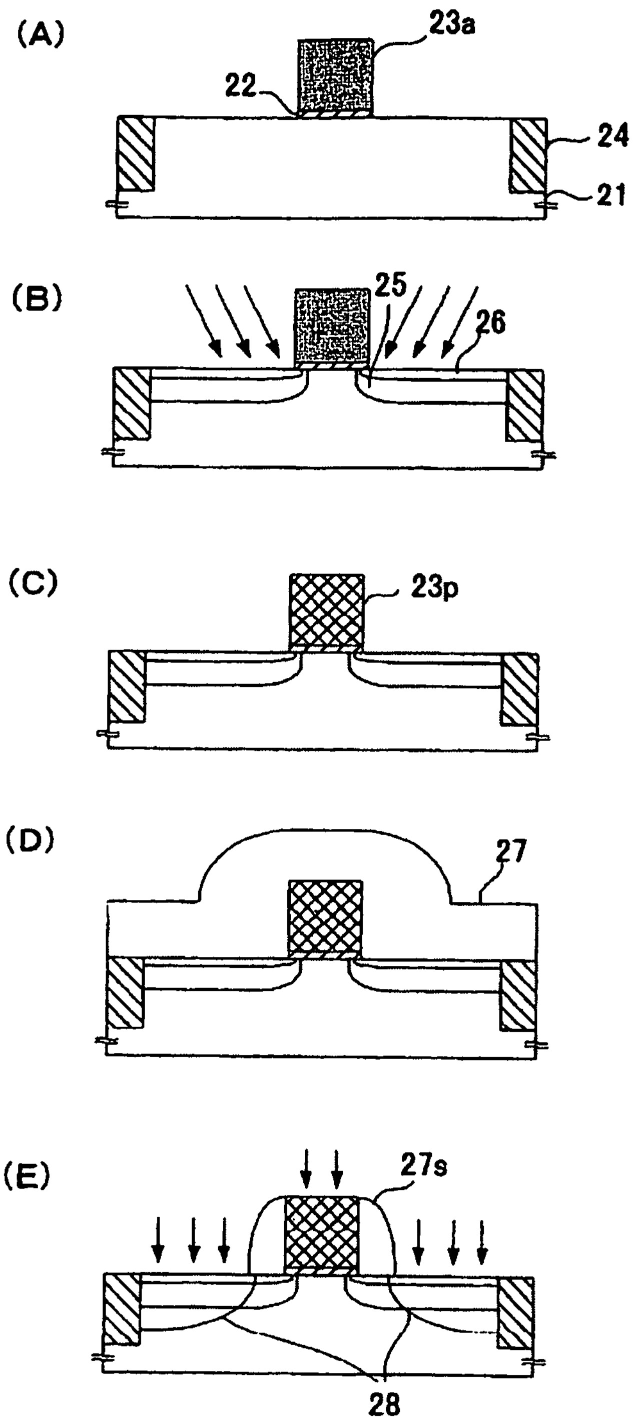
FIG. 8(A)-(E) are cross-sectional views showing processes to manufacture an nMOS transistor in the first example of the second embodiment of the present invention.

As shown in FIG. 8(A), a gate insulating film 22, and a non-doped amorphous silicon gate pattern 23*a* are formed on a silicon substrate 21. Gate length is preferably set to 40 nm.

As shown in FIG. 8(B), a pocket region 25 is formed by implanting a pocket impurity from a diagonal direction to the surface of the silicon substrate 21. Moreover, an extension region 26 is also formed as required.

Next, as shown in FIG. 8(C), the amorphous silicon gate pattern 23*a* is crystallized through an annealing process in order to form a polycrystal silicon gate pattern 23*p*. Annealing conditions may be adjusted as required but the preferable annealing temperature is 600° C. or higher. In this example, the annealing is executed for 30 minutes in a nitride atmosphere at 650° C.

Next, as shown in FIG. 8(D), an insulating film 27 is deposited on the entire surface.

Next, as shown in FIG. 8(E), the insulating film 27 is removed by anisotropic etching to form side wall spacer 27*s* and thereafter ion implantation of the source/drain impurity is executed. Here, since the nMOS is explained as an example, P and As are implanted to the silicon substrate 21 as the impurity. In this case, the impurity is also implanted simultaneously to the polycrystal silicon gate 23*p*.

According to the second embodiment, since the silicon layer of gate pattern is in the amorphous state during the process to conduct implantation of the pocket impurity, fluctuation of the pocket region can be suppressed. Moreover, by conducting a process to convert the amorphous silicon gate pattern 23*a* to a polycrystal silicon layer before the source/drain and gate electrode impurity implantation process but after the pocket impurity implantation, the impurity implanted to the gate pattern diffuses properly preventing the formation of a depletion layer.

In this example, the amorphous silicon crystallization process and the insulating film 27 depositing process of FIG. 8(C) have been explained as different processes, but it is also possible to simultaneously crystallize the amorphous silicon gate pattern 23*a* during the process to form the insulating film 27 thereby eliminating the process of FIG. 8(C). For example, a silicon oxide film is formed using tetraethoxysilane ($Si[OC_2H_5]_4$) gas and oxygen ($O_2$) gas as the raw materials under the substrate temperature of 800° C. by means of, for example, a CVD method. The amorphous silicon gate pattern 23*a* is crystallized in accordance with the film forming temperature. In place of the silicon oxide film, a silicon nitride film may also be formed.

Second Example

FIGS. 9(A) to 9(E) are cross-sectional views of the processes to manufacture a nMOS transistor according to the second example of the second embodiment. In these cross-sectional views, the elements similar to those in the first example are defined with the same reference numerals and the explanation of these elements is omitted below.

Figure 9:
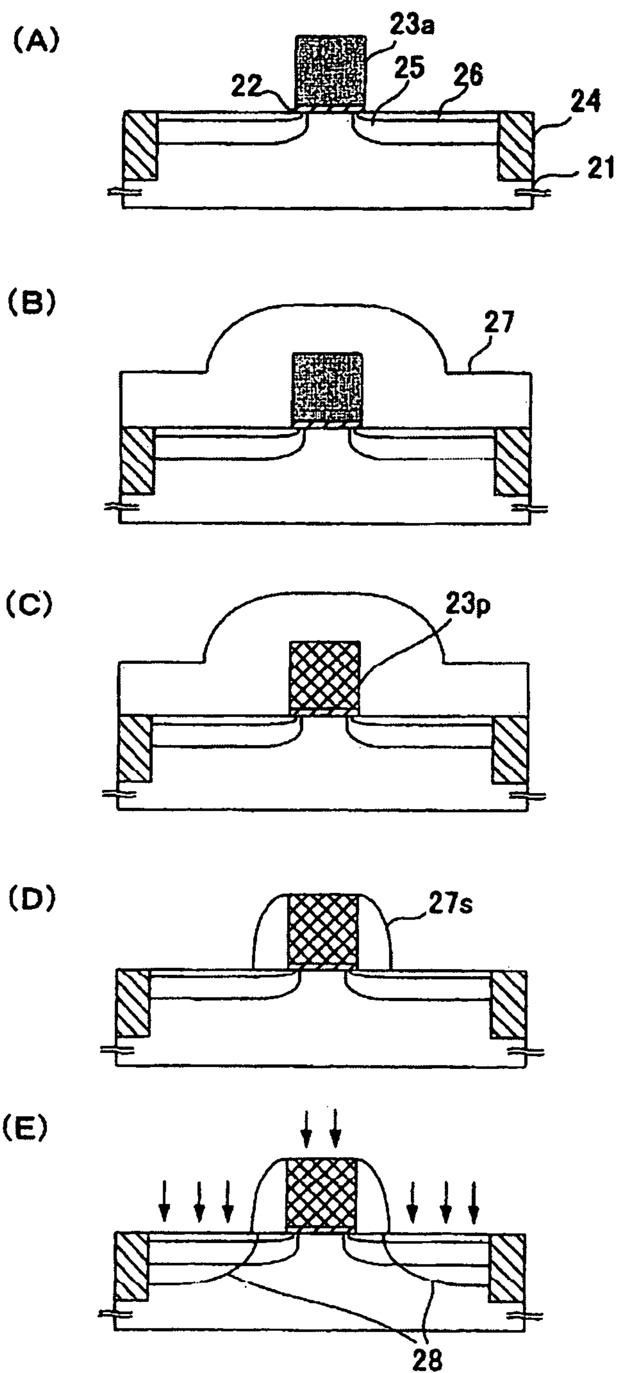
FIG. 9(A)-(E) are cross-sectional views showing processes to manufacture an nMOS transistor in the second example of the second embodiment of the present invention.

As shown in FIG. 9(A), a gate insulating film 22, an amorphous silicon gate pattern 23*a*, and a pocket region 25 are formed on a silicon substrate 21. Moreover, an extension region 26 is also formed as required.

Next, as shown in FIG. 9(B), the insulating film 27 is deposited over the entire surface of the silicon substrate 11 to cover the amorphous silicon gate pattern 23*a*. The insulating film 27 is formed under conditions which prevent crystallization of the amorphous silicon gate pattern 23*a*, by utilizing a process, at a temperature of 600° C. or lower and more preferably, at a temperature of 550° C. or lower. In this example, a silicon oxide film is formed with the CVD method with a substrate temperature of 500° C., using disilane ($Si_2H_6$) and oxygen ($O_2$) as the raw materials. In addition to the silicon oxide film, a silicon nitride film and a stacked film of silicon oxide film and silicon nitride film or the like may also be adapted.

Next, as shown in FIG. 9(C), an annealing process is executed under the condition that the amorphous silicon gate pattern 23*a* is covered with the insulating film 27. Thereby, the amorphous silicon gate pattern 23*a* is crystallized to form a polycrystal silicon gate pattern 23*p*. The preferable annealing temperature is 600° C. or higher and the annealing is executed for 30 minutes in a nitrogen atmosphere at 650° C. in this example.

Then, as shown in FIG. 9(D), the insulating film 27 at the region other than the side wall of the polycrystal silicon gate pattern 23*p* is removed by anisotropic etching to form a side wall spacer 27*s*.

As shown in FIG. 9(E), the source/drain and gate electrode impurity implantation is conducted.

According to the second example of the second embodiment, since the annealing for crystallization of the amorphous silicon gate pattern 23*a* is executed under the condition that the amorphous silicon gate electrode 23*a* is covered with the insulating film 27, roughening of the gate pattern surface during the crystallization process is prevented.

Moreover, high-speed operation of the nMOS transistor can also be attained by distorting the crystal lattice of the channel region by utilizing expansion of the gate pattern when the amorphous silicon gate pattern 23*a* is crystallized. This effect will be explained later in the case of the fourth embodiment.

Third Example

FIGS. 10(A) to 10(E) are cross-sectional views of processes to manufacture an nMOS transistor in the third example of the second embodiment. In these cross-sectional views, the elements similar to those in the first or second example are defined with the same reference numerals and the explanation of these elements is omitted below.

Figure 10:
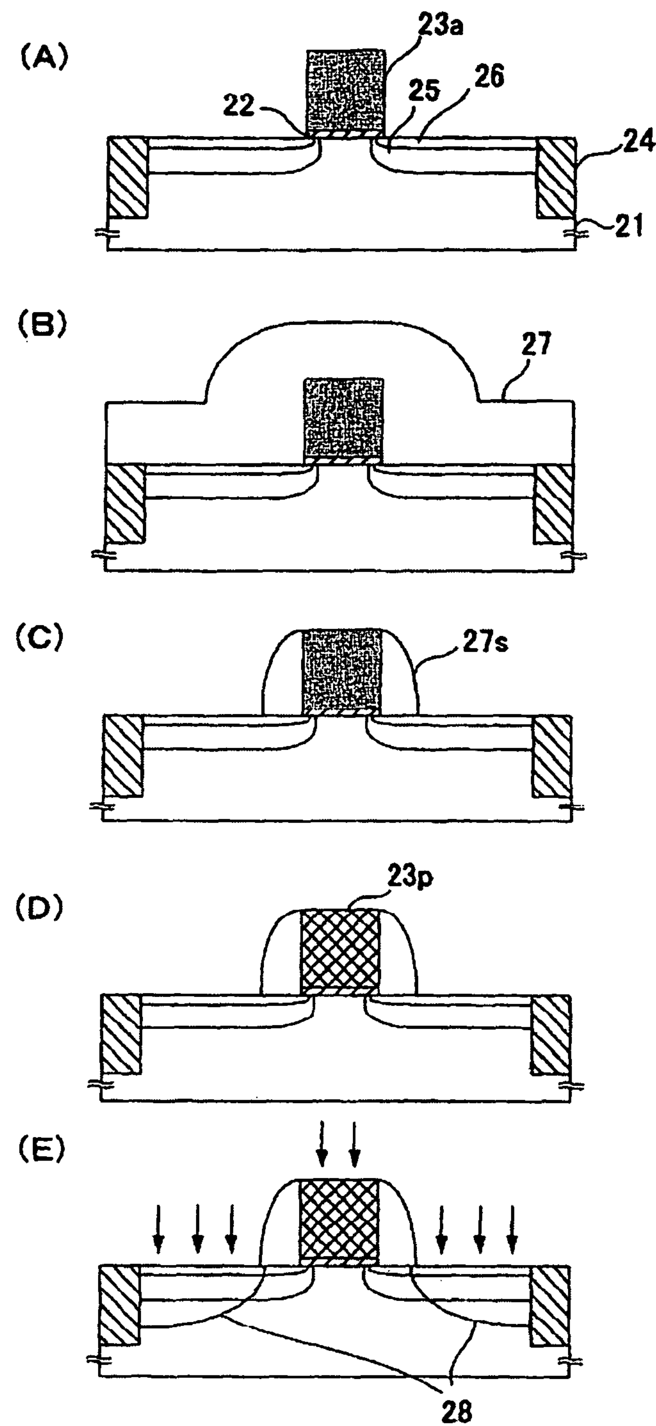
FIG. 10(A)-(E) are cross-sectional views showing processes to manufacture an nMOS transistor in the third example of the second embodiment of the present invention.

As shown in FIG. 10(A), a gate insulating film 22, an amorphous silicon gate pattern 23*a*, and a pocket region 25 are formed on a silicon substrate 21. Moreover, an extension region 26 is also formed as required.

As shown in FIG. 10(B), an insulating film 27 is deposited over the entire surface. The insulating film 27 is formed under the condition for preventing crystallization of the amorphous silicon gate pattern 23*a* as in the case of FIG. 9(B) of the second example.

Next, as shown in FIG. 10(C), a side wall spacer 27*a* is formed by anisotropic etching of the insulating film 27.

Next, as shown in FIG. 10(D), the amorphous silicon gate pattern 23*a* is crystallized by executing an annealing process for 30 minutes at the temperature of 650° C., for example, in a nitrogen atmosphere.

In comparison to the second example, difference is found only in the replacement of the process to form the side wall spacer 27*s* with the anisotropic etching of the insulating film 27 and the process to crystallize the amorphous silicon gate pattern 23*a* with the annealing process.

According to the third example, the upper surface of the amorphous silicon gate pattern 23*a* is not covered with the insulating film 27 during the annealing process for crystallization but the side surface is covered with the side wall spacer 27*s*. Therefore, roughening of the sidewall of the gate pattern is prevented during the crystallization of amorphous silicon. Moreover, even in this example, the effect to distort the crystal lattice of the channel region can be attained by expansion of the gate pattern.

Fourth Example

FIGS. 11(A) to 11(G) are cross-sectional views of the processes to manufacture an nMOS in the fourth example of the second embodiment. In these cross-sectional views, the elements similar to those in the first to the third examples are defined with the same reference numerals and their explanation is omitted below.

Figure 11:
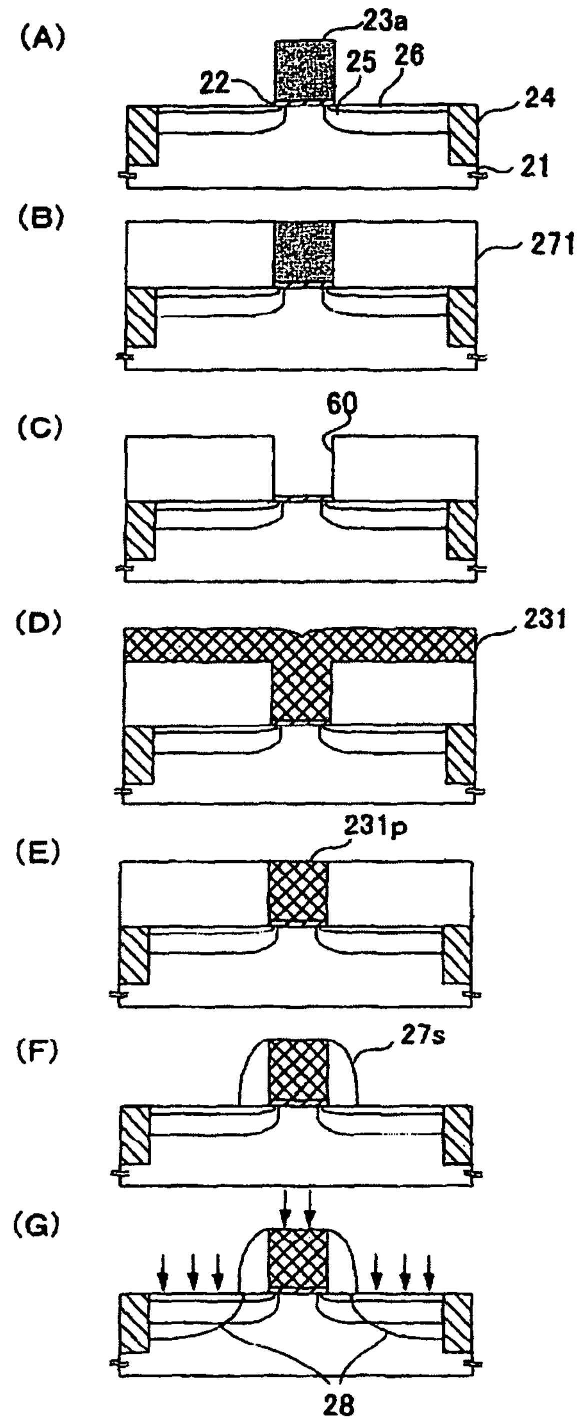
FIG. 11(A)-(G) are cross-sectional views showing processes to manufacture an nMOS transistor in the fourth example of the second embodiment of the present invention.

First, as shown in FIG. 11(A), a gate insulating film 22, and an amorphous silicon gate pattern 23*a* are formed on a silicon substrate 21 to form a pocket region 25 and extension region 26.

Next, as shown in FIG. 11(B), after an insulating film 271 is deposited over the entire surface to cover the amorphous silicon gate pattern 23*a*, the upper surface of the amorphous silicon gate pattern 23*a* is exposed with by CMP processing. The insulating film 271 is formed under the condition that the amorphous silicon gate pattern 23*a* is not crystallized.

Next, as shown in FIG. 11(C), the amorphous silicon gate pattern 23*a* is removed by an etching process to form a recessed region 60 on the insulating film 271.

Next, as shown in FIG. 11(D), a polycrystal silicon layer 231*p* is deposited by a CVD method to fill the recessed region 60.

As shown in FIG. 11(E), the polycrystal silicon layer 231*p* on the insulating film 271 is removed by CMP.

Thereafter, as shown in FIG. 11(F), the insulated film 271 is removed and a side wall spacer 27*s* is then formed using the other insulating film.

As shown in FIG. 11(G), source/drain and gate electrode impurity implantation is conducted. According to this embodiment, a polycrystal silicon gate pattern 231*p* can be formed, without requiring crystallization of the amorphous silicon gate pattern 23*a* by the annealing process. Therefore, a problem about roughness at the surface of silicon gate pattern due to the annealing for crystallization can be avoided, fluctuation of pocket region can be controlled and depletion of gate electrode can be prevented. This embodiment can also be adapted to manufacturing processes of the pMOS transistor.

Third Embodiment

First Example

In general, impurities, such as B or P in a silicon substrate, are activated by conducting annealing (conducted under higher temperature of 1000 to 1050° C.) after implantation of the impurity. In recent years, In is used as the pocket impurity for the nMOS transistor. The reason is that when In is used as the pocket impurity, a steep concentration profile can be obtained even after the activation annealing. However, In has the special property that activation is impossible if activation annealing is not carried out under the condition wherein the silicon includes a large amount of crystal defects.

When In is implanted with the ion implantation method to the silicon substrate as the pocket impurity of the nMOS transistor, crystal property of the silicon substrate is broken with the implantation energy of In and an amorphous layer is formed on the upper surface of the silicon substrate. Therefore, when the activation annealing is conducted under this condition, In is activated.

However, since the activation annealing of the pocket impurity is executed at a concurrent time with the activation of the source/drain impurity and gate electrode impurity, a technique preventing crystallization of the amorphous layer on the surface of the silicon substrate up to the point of the simultaneous activation annealing process is required.

When annealing is conducted for 30 minutes at the temperature of 650° C. for crystallization of the amorphous silicon gate pattern 23*a* after the pocket impurity implantation process as explained in the first to third examples of the second embodiment, the amorphous layer on the surface of silicon substrate is also crystallized simultaneously. In this case, In cannot be activated sufficiently even when the activation annealing is conducted thereafter.

The embodiment for solving the above problems will be explained below. FIGS. 12(A) to 12(F) are cross-sectional views of processes to manufacture an nMOS transistor in the first example of the third embodiment.

Figure 12:
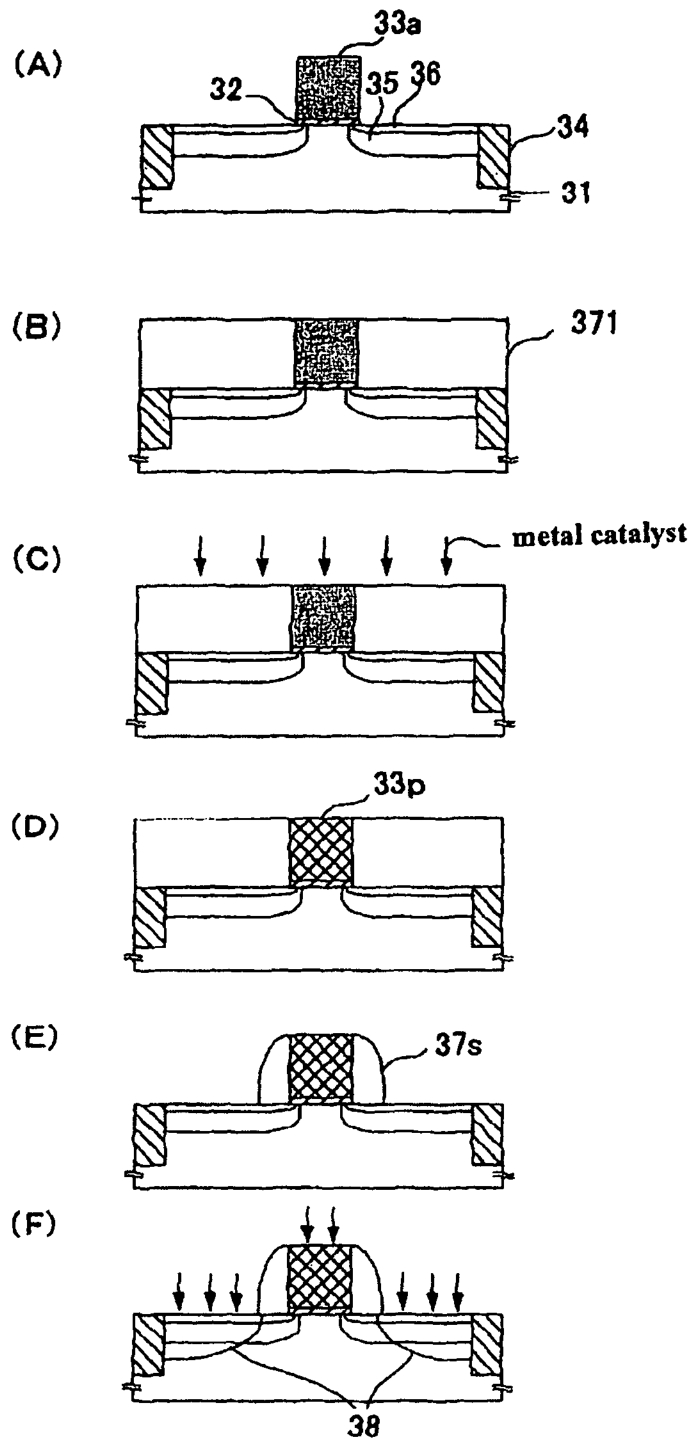
FIG. 12(A)-(F) are cross-sectional views showing processes to manufacture an nMOS transistor in the first example of the third embodiment of the present invention.

First, as shown in FIG. 12(A), a gate insulating film 32, a non-doped amorphous silicon gate pattern 33*a*, and a pocket region 35 are formed on a silicon substrate 31. Moreover, an extension region 36 is formed, as required. Particularly, in the third embodiment, In is used as the pocket impurity. Crystallization on the surface of silicon substrate 31 is broken and an amorphous layer is formed by the ion implantation of In into the silicon substrate 31.

As shown in FIG. 12(B), an insulating film 371 is deposited over the entire surface and the upper surface of the amorphous silicon gate pattern 33*a* is exposed by a CMP. As the insulating film 371, a silicon oxide film and a silicon nitride film may be adapted but this film is formed under the condition that the amorphous layer formed on the surface of silicon substrate 31 is never crystallized. More specifically, this film is formed at the substrate temperature of 600° C. or lower, more preferably, 500° C. or lower. In this example, a silicon oxide film is deposited with the CVD method using the disilane ($Si_2H_6$) gas and oxygen gas ($O_2$) as the raw materials at the substrate temperature of 500° C. Under this condition, the amorphous silicon gate pattern 33*a* is not crystallized.

Next, as shown in FIG. 12(C), Ni is implanted, as a metal catalyst, to the amorphous silicon gate pattern 33*a* with the ion implantation method. Ni implanted to the amorphous silicon gate pattern 33*a* works as a metal catalyst, and thereby allows solid-phase growth of silicon at a lower temperature. With Ni as a catalyst, the amorphous silicon gate pattern 33*a* can be crystallized at a temperature lower than the ordinary temperature for crystallization of the amorphous silicon layer. Since the surface of silicon substrate 31 is covered with the insulating film 371, Ni is not implanted to the silicon substrate. As the metal catalyst, Fe may also be used as a substitute for Ni.

In FIG. 12(D), the amorphous silicon gate pattern 33*a* is crystallized with the annealing process. For this annealing, the temperature is selected for realizing crystallization of the amorphous silicon gate pattern 33*a* and not allowing crystallization of the amorphous layer formed on the surface of the silicon substrate 31. The desirable annealing temperature is 600° C. or lower, and a more preferable annealing temperature is 450° C. to 550° C. Here, the annealing has been conducted for 30 minutes at 500° C. in a nitrogen atmosphere.

In the processes shown in FIGS. 12(B) to 12(D), the method for introducing the metal catalyst on the upper surface of the amorphous silicon gate pattern using the ion implantation technology has been described. However, the method for introducing the metal catalyst is not restricted to these processes and other methods for selectively introducing the metal catalyst such as Ni or the like to the amorphous silicon gate pattern 33*a* may also be employed. For example, it is also possible, after the processes of FIG. 12(B), that the metal catalyst such as Ni or the like is deposited on the amorphous silicon gate pattern 33*a* with the sputtering method and Ni or the like is then introduced from the upper surface of the amorphous silicon gate pattern 33*a* by a heating process.

Next, in the process of FIG. 12(E), the insulating film 371 is removed with the etching process and a side wall spacer 37*s* is formed using the other insulating film. A silicon oxide film is deposited on the insulating film for side wall spacer 37*s* under the condition that the amorphous layer on the surface of the silicon substrate 31 is not crystallized, for example, at the substrate temperature of 500° C. with the CVD method using disilane ($Si_2H_6$) gas and oxygen gas ($O_2$) as the raw materials.

As shown in FIG. 12(F), the source/drain and gate electrode impurity implantation are implanted into the silicon substrate 31 and the impurity activation annealing is then conducted for activating the pocket impurity, the source/drain impurity and the gate impurity. The annealing can be conducted by diffusing furnace annealing, lamp annealing, or laser annealing. For example, the annealing is executed for several milliseconds to about 10 seconds at 1000 to 1050° C. in a nitrogen atmosphere.

According to the third embodiment, fluctuation within the pocket region is suppressed because the gate pattern is amorphous silicon during the pocket impurity implantation process. Moreover, for crystallization of the amorphous silicon gate pattern before the source/drain and gate electrode impurity implantation, the impurity implanted to the gate pattern diffuses downward. In addition, In as the pocket impurity can be activated in the annealing process for activation of impurity by selectively crystallizing only the gate pattern under the condition that the amorphous silicon layer in the pocket region is not crystallized.

In this example, the metal catalyst has been introduced in the process of FIG. 12(D). A metal impurity may also be introduced to the entire surface of the amorphous silicon layer before formation of gate pattern during the processing of the amorphous silicon layer in the process of FIG. 12(A).

Second Example

FIGS. 13(A) to 13(F) are cross-sectional views of processes to manufacture an nMOS transistor in the second example of the third embodiment. In this figure, the elements similar to those in the first example are designated with the same reference numerals and the descriptions thereof are omitted below.

Figure 13:
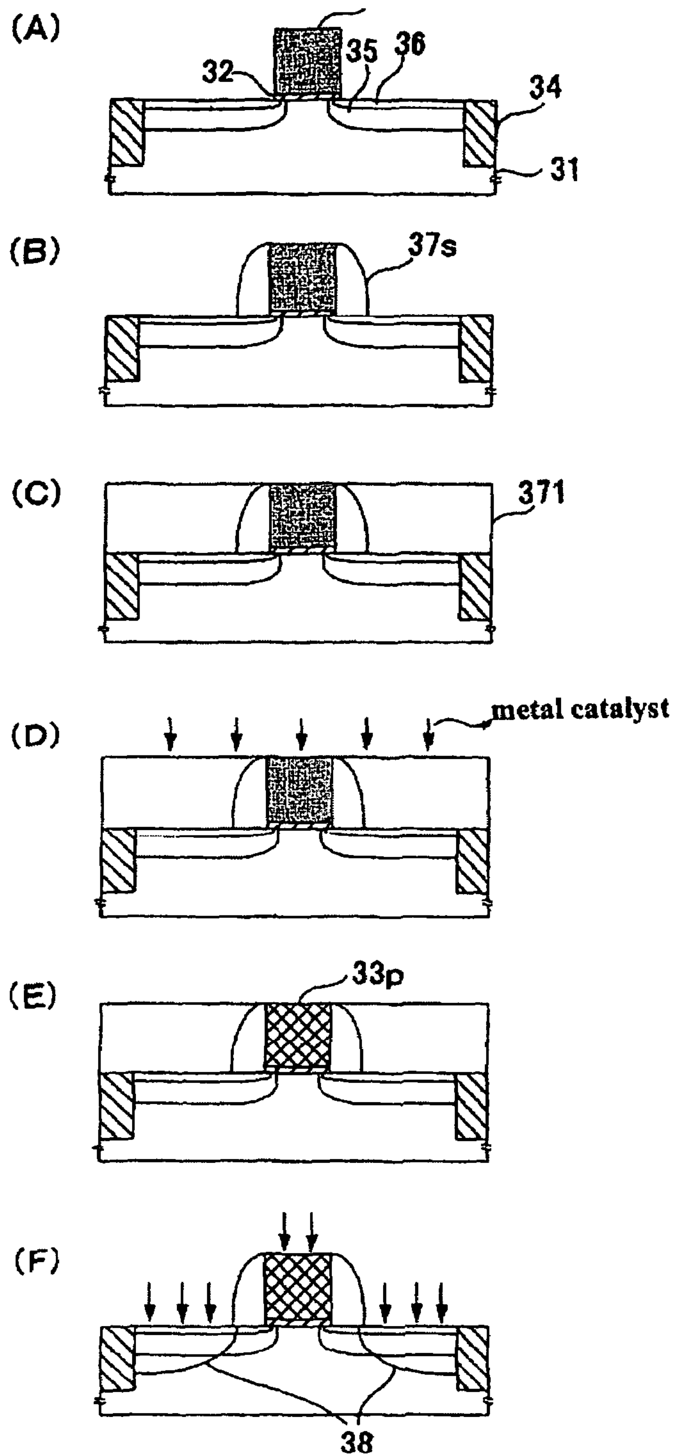
FIG. 13(A)-(F) are cross-sectional views showing processes to manufacture an nMOS transistor in the second example of the third embodiment of the present invention.

First, as shown in FIG. 13(A), a gate insulating film 32, an amorphous silicon gate pattern 33*a*, and a pocket region 35 are formed on a silicon substrate 31. Moreover, an extension region 36 is also formed as required.

As shown in FIG. 13(B), a side wall spacer 37*s* formed of an insulating film is then formed. The insulating film for side wall spacer 37*s* is formed, as in the case of FIG. 12(B), under the condition that the amorphous silicon layer formed on the silicon substrate 31 is not crystallized.

Next, as shown in FIG. 13(C), an insulating film 371 different from the side wall spacer 37*s* in the etching characteristic is deposited over the entire surface under the condition that the amorphous silicon is never crystallized and the upper surface of the amorphous silicon gate pattern 33*a* is exposed using CMP.

As shown in FIG. 13(D), Ni is implanted as a metal catalyst into the amorphous silicon gate pattern 33*a* with the ion implantation method.

As shown in FIG. 13(E), the amorphous silicon gate pattern 33*a* is crystallized with the annealing process. This annealing is executed at a temperature preventing crystallization of the amorphous layer formed on the surface of the silicon substrate 31.

Next, as shown in FIG. 13(F), the insulating film 371 is removed by an etching process and the impurity implantation for the source/drain and gate electrode is performed. Thereafter, the impurity activation annealing is conducted to activate the pocket impurity, source/drain impurity, and gate impurity.

In this example, the side wall spacer 37*s* is formed before the crystallization process of the amorphous silicon gate pattern 33*a* and it is not removed even after the crystallization process. The effect of the fourth embodiment described later may also be attained with these processes.

Fourth Embodiment

First Example

It is known that when the silicon crystal lattice is distorted, the mobility of electrons with in the lattice changes and therefore investigations have been conducted to ascertain processes in view of attaining a means for improving the operation rate of a MOS transistor formed on a semiconductor substrate by distorting the silicon crystal lattice.

When epitaxial growth is executed to realize lattice matching of materials having different lattice constants of crystal, a problem is caused in which the energy from the distortion generated in the crystal becomes large. This dislocation is generated in the crystal when the thickness becomes equal to or exceeds a certain critical thickness.

Even when the amorphous silicon gate pattern is expanded through the crystallization process, it is impossible for the gate pattern to freely expand upwardly to thereby generate a stress to suppress the silicon substrate in the lower direction, if the gate pattern is not covered with a certain film.

Figure 14:
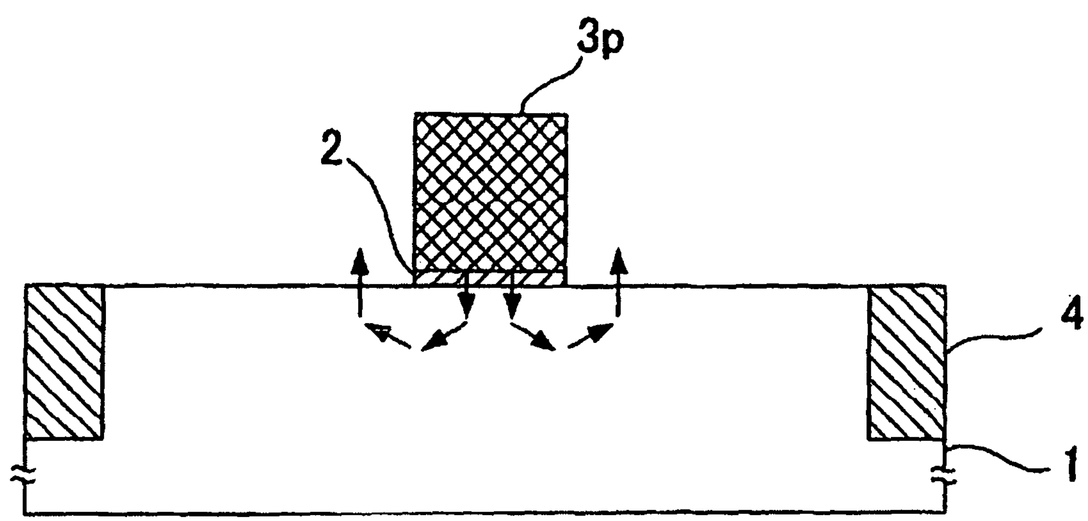
FIG. 14 is a cross-sectional view showing a profile where a compression stress applied to a silicon substrate from a gate pattern is released from the silicon substrate surfaces in both sides of the gate pattern.

Moreover, even when a compressing stress is applied to the silicon substrate with expansion of the gate pattern, the silicon crystal cannot be distorted because the stress is released from the silicon substrate surfaces in both sides of the gate pattern. FIG. 14 is a cross-sectional view showing a profile of the stress applied to the silicon substrate from the gate pattern. The stress is released from the front surfaces of silicon substrate at both sides of the gate pattern.

FIGS. 15(A) to 15(E) are cross-sectional views of the processes to manufacture an nMOS transistor in the first example of the fourth embodiment.

Figure 15:
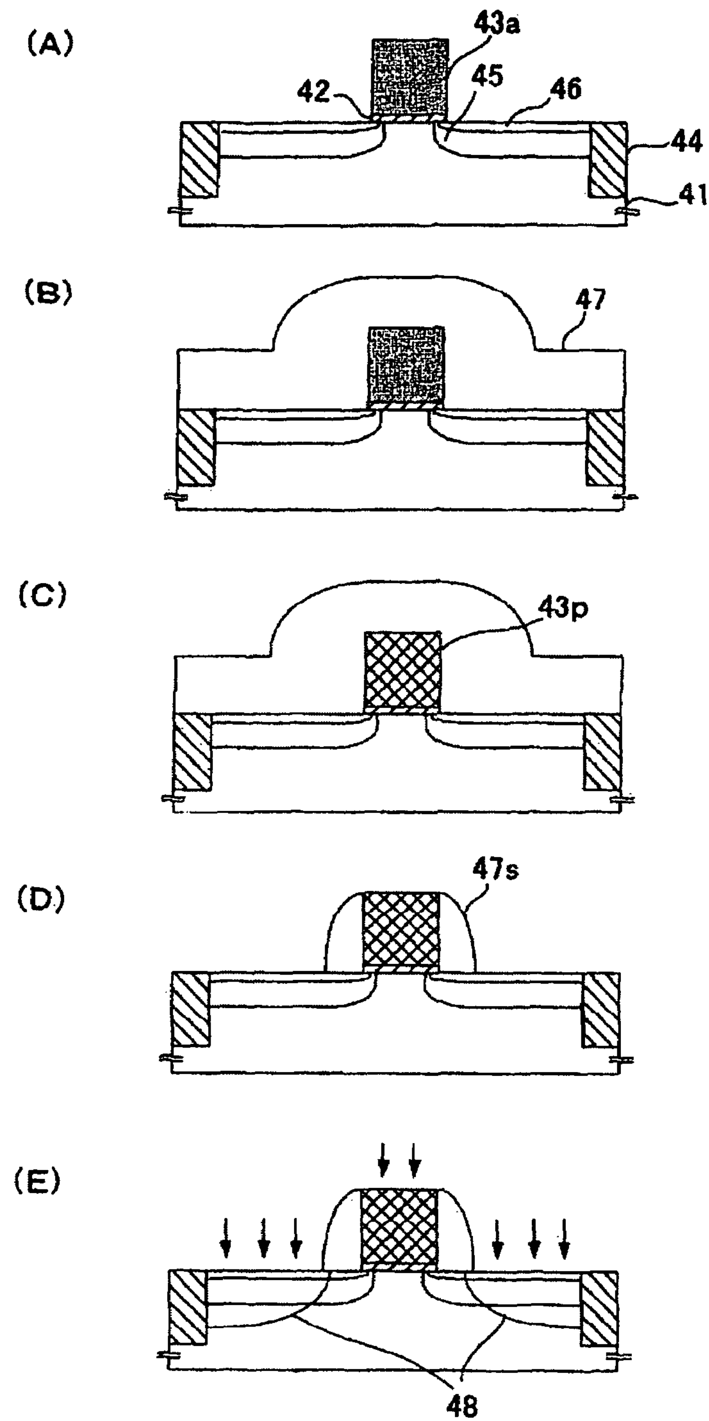
FIG. 15(A)-(E) are cross-sectional views showing processes to manufacture an nMOS transistor in the first example of the fourth embodiment of the present invention.

As shown in FIG. 15(A), a gate insulating film 42, and an amorphous silicon gate pattern 43*a* are formed on a silicon substrate 41. A pocket region 45 and an extension region 46 are also formed as required.

As shown in FIG. 15(B), an insulating film 47 is deposited on the entire surface of the silicon substrate 41 to cover the amorphous silicon gate pattern 43*a*. For example, a silicon oxide film and a silicon nitride film may also be adapted. This insulating film 47 is formed under the condition that the amorphous silicon gate pattern 43*a* is not crystallized. For example, the silicon oxide film is formed at the thickness of about 5 to 120 nm by a CVD method using disilane ($Si_2H_6$) gas and oxygen ($O_2$) gas as the raw materials at a substrate temperature of 500° C.

Next, as shown in FIG. 15(C), the annealing process is conducted to crystallize the amorphous silicon gate pattern 43*a* under the condition that this amorphous silicon gate pattern 43*a* is covered with the insulating film 47. For example, an annealing process is performed for 5 to 12 hours at a temperature of 550° C. in a nitrogen atmosphere. This annealing condition has been set as the condition under which the amorphous silicon gate pattern 43*a* is expanded with crystallization and impurity in the silicon substrate 41 does not diffuse.

As shown in FIG. 15(D), a side wall spacer 47*s* is formed to the side wall of gate pattern through anisotropic etching of the insulating film 47.

Next, as shown in FIG. 15(E), an nMOS transistor is produced by source/drain and gate electrode impurity implantation.

In the first example of the fourth embodiment, the gate pattern diffusing upward through crystallization is prevented by annealing under the condition that the amorphous silicon gate pattern 43*a* is covered with the insulating film 47. Thereby a compression stress is applied to the channel region under the gate pattern. Moreover, since the regions nearby the region where the gate pattern is formed are covered at the time of processing, for example, both side regions of the gate pattern are covered with the insulating film, a stress applied to the silicon substrate 41 under the gate pattern is never released to the upper side from the surface of the silicon substrate 41 by passing through both sides of the gate pattern. Moreover, since a part of the insulating film 47 covering the gate pattern in the crystallization process of the amorphous silicon gate pattern 43*a* is left and side wall spacer 47*s* is formed, the silicon crystal lattice can be maintained in the distorted state without release of stress applied to the channel region. Thickness of the side wall spacer 47*s* may be adjusted as required because the stress for holding such distorted state is varied in accordance with the thickness thereof.

Moreover, as the insulating film 47, a silicon oxide film, a silicon nitride film and a stacked layer structure of a silicon oxide film and a silicon nitride film can also be adapted.

This fourth embodiment can also be adapted to the process for crystallization with the annealing of amorphous silicon gate pattern described in the second and third examples of the second embodiment and in the second example of the third embodiment. In this case, the silicon crystal in the channel region can be distorted by crystallization of the gate pattern in addition to the effects respectively obtained with the second and third embodiments and thereby high-speed operation of the MOS transistor can also be realized.

Second Example

Figure 16:
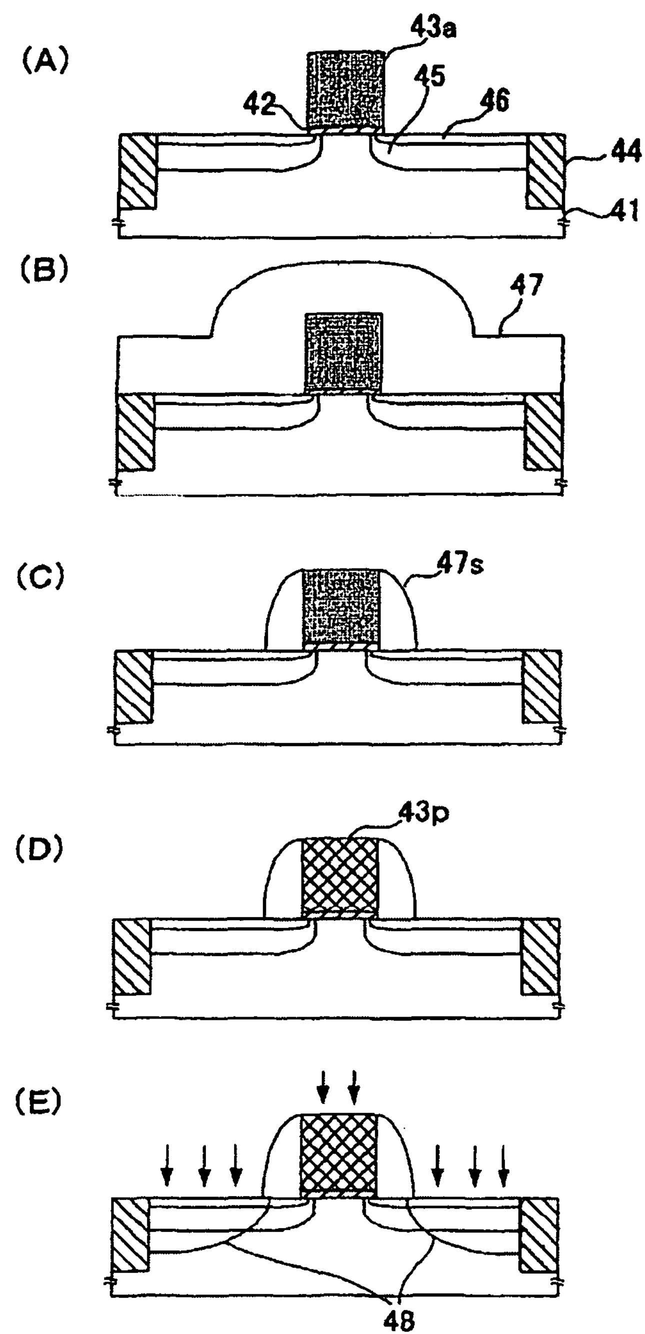
FIG. 16(A)-(E) are cross-sectional views showing processes to manufacture an nMOS transistor in the second example of the fourth embodiment of the present invention.

FIGS. 16(A) to 16(B) are cross-sectional views of processes to manufacture an nMOS transistor in the second example of the fourth embodiment. In these cross-sectional views, the elements similar to those in the first example are designated with the same reference numerals and the description thereof is omitted below.

In FIG. 16(A), a gate insulating film 42 and an amorphous silicon gate pattern 43*a* are formed on a silicon substrate 41. A pocket region 45 and an extension region 36 are also formed as required.

In FIG. 16(B), an insulating film 47 is deposited on the entire surface of the silicon substrate 41, as in the case of FIG. 15(B) in order to cover the amorphous silicon gate pattern 43*a* under the condition that the amorphous silicon gate pattern 43*a* is not crystallized.

In FIG. 16(C), a side wall spacer 47*s* is formed to the side wall of a gate pattern with anisotropic etching of the insulating film 47.

Next, in FIG. 16(D), annealing is conducted to crystallize the amorphous silicon gate pattern 43*a*.

In FIG. 16(E), an nMOS transistor is produced by conducting the source/drain and gate electrode impurity implantation.

In the first example, an example of crystallization annealing under the condition that the entire surface of the amorphous silicon gate pattern 43*a* is covered with the insulating film 47 has been described, but the second example is different from the first example in such a point that the annealing for crystallization of the amorphous silicon gate pattern 43*a* is conducted after anisotropic etching of the insulating film 47 to form the side wall spacer 47*s*.

Even in this second example, a compression stress can be applied to a channel region by utilizing expansion of the gate pattern because the gate pattern crystallization annealing is conducted after the side wall spacer 47*s* is formed on the side wall of the amorphous silicon gate pattern 43*a*. Likewise, distortion of the silicon crystal lattice by the compression stress is maintained by the side wall spacer 47*s*.

Third Example

High-speed operation of the nMOS transistor can be realized by applying a stress to compress the silicon crystal lattice in the channel region in the longitudinal direction, and high-speed operation of the pMOS transistor may be realized by applying a tensile stress in the longitudinal direction.

Therefore, when a CMOS transistor is formed with the method described in the first and second examples of the fourth embodiment, the characteristics of the nMOS transistor can be improved while the characteristics of the adjacent pMOS transistor is deteriorated. Accordingly, a means for generating crystal distortion within the nMOS transistor but negating the distortion within the pMOS transistor is required.

FIGS. 17(A) to 17(F) are cross-sectional views of processes to manufacture a CMOS transistor in the third example of the fourth embodiment. In these cross-sectional views, the elements similar to those in the first or second example are designated with the same reference numerals and the descriptions thereof are omitted below.

Figure 17:
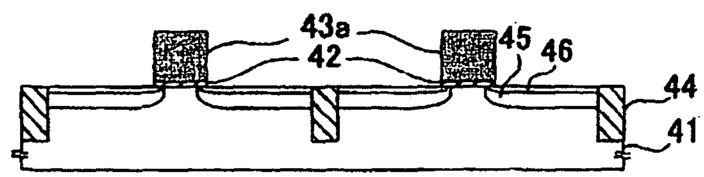
FIG. 17(A)-(F) are cross-sectional views showing processes to manufacture a CMOS transistor in the third example of the fourth embodiment of the present invention.
Figure 17:
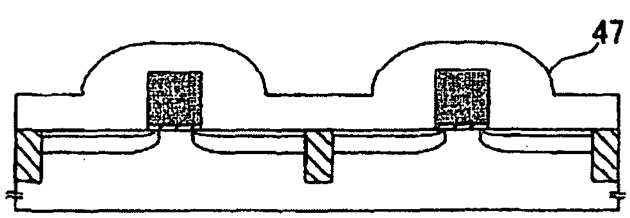
Figure 17:
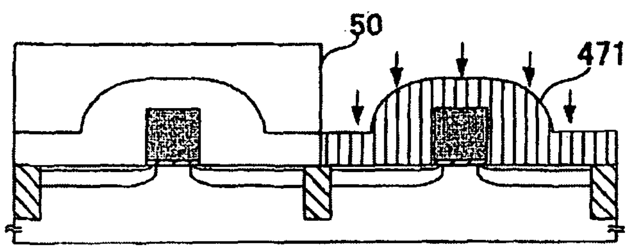
Figure 17:
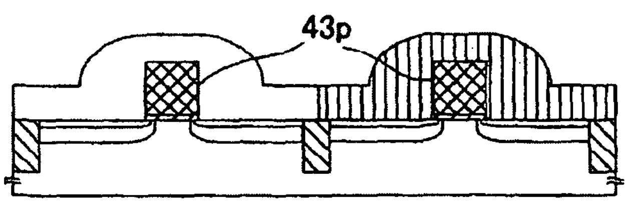
Figure 17:
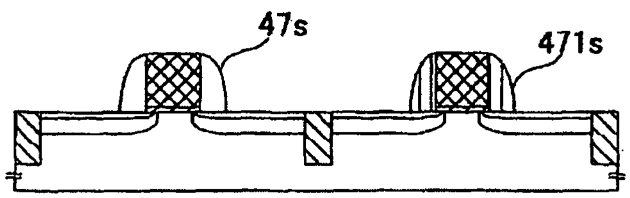
Figure 17:
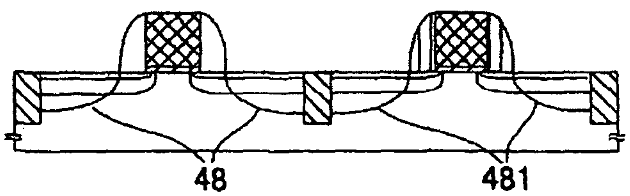

First, in FIG. 17(A), a gate insulating film 42 and an amorphous silicon gate pattern 43*a* are formed in the active region isolated with an element isolating region 44 and a pocket region 45 and an extension region 46 are also formed as required.

As shown in FIG. 17(B), an insulating film 47 is deposited covering the amorphous silicon gate pattern 43*a*. As the insulating film 47, a silicon oxide film and a silicon nitride film can be adapted. The insulating film 47 is formed under the condition that the amorphous silicon gate pattern 43*a* is not crystallized.

As shown in FIG. 17(C), an insulating film 471 having coarse film quality is formed by opening only the pMOS region using a resist film 50 and implanting Ge, for example, to the insulting film 47 covering the pMOS region. For example, Ge is implanted in the dose of $3\times10^{14}$/cm2 to $3\times10^{14}$/cm2.

As shown in FIG. 17(D), crystallization annealing of the amorphous silicon gate pattern 43*a* is conducted after the resist 50 is removed. Specifically, annealing is performed for 5 to 12 hours at 550° C. in a nitrogen atmosphere.

As shown in FIG. 17(E), the side wall spacers 47*s* and 471*s* are formed with anisotropic etching of the insulating films 47, 471. Thereafter, the source/drain regions 48, 481 are respectively formed within the nMOS region and pMOS region.

Since the pMOS region is covered with the insulating film 471 having coarse film quality in the process for crystallizing the amorphous silicon gate pattern 43*a*, the stress applied to the channel region of the pMOS transistor is released more easily through the side wall spacer region than the stress applied to the channel region of the nMOS transistor. As a result, silicon crystal lattice distortion in the channel region of the pMOS transistor is suppressed to maintain the characteristic of the pMOS transistor.

Fourth Example

FIGS. 18(A) to 18(G) are cross-sectional views of the processes to manufacture a CMOS transistor in the fourth example of the fourth embodiment. In these cross-sectional views, the elements similar to those with the same reference numerals are utilized and the descriptions of these elements are omitted below.

Figure 18:
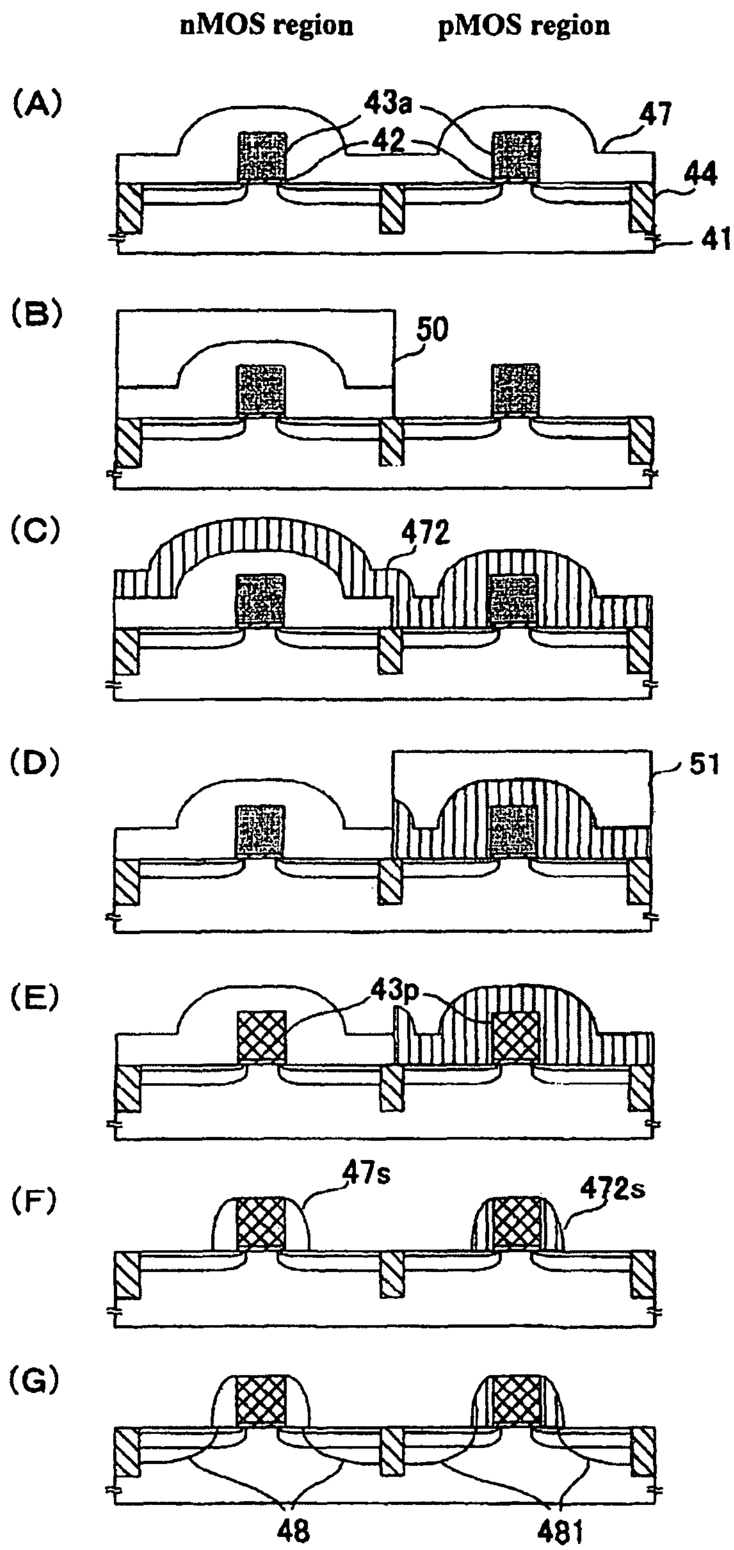
FIG. 18(A)-(G) are cross-sectional views showing processes to manufacture a CMOS transistor in the fourth example of the fourth embodiment of the present invention.

First, in FIG. 18(A), a gate insulating film 42 and an amorphous silicon gate pattern 43*a* are formed on an active region isolated with an element isolating region 44, and a pocket region 45 and an extension region 46 are also formed as required. Moreover, an insulating film 47 is deposited covering the amorphous silicon gate pattern 43*a*.

As shown in FIG. 18(B), after the nMOS region is covered with a resist film 50, the insulating film 47 on the pMOS is removed.

As shown in FIG. 18(C), the insulating film 472 having a film quality coarser than the insulating film 47 is deposited over the entire surface. As the insulating film 472, a silicon oxide film and a silicon nitride film may be adapted but a silicon oxide film is formed, for example, by a CVD method at the substrate temperature of 540° C. using bistartial-buthylaminosilane ($SiH_2[NH—C_4H_9]_2$) as the raw material.

Next, as shown in FIG. 18(D), the pMOS region is covered with a resist film 51 and the insulating film 472 on the insulating film 47 is removed by etching.

As shown in FIG. 18(E), the amorphous silicon gate pattern 43*a* is crystallized by annealing.

As shown in FIG. 18(F), the insulting films 47, 472 are removed with the anisotropic etching to form the side wall spacers 47*s* and 472*s*.

Finally, as shown in FIG. 18(G), the source/drain region is formed respectively to the nMOS region and the pMOS region to complete a CMOS structure.

In this example, the insulating film 47 covering the pMOS region is removed and the pMOS region is covered with the insulating film 472, for example, having coarse film quality to release more easily the stress applied to the channel region than the insulating film 47. Therefore, a compression stress applied to the channel region of the pMOS transistor is smaller than that applied to the nMOS transistor and amount of distortion can be suppressed.

The silicon substrate has been described as an example of a semiconductor substrate in the first to fourth embodiments but this semiconductor substrate can also be adapted, for example, to a silicon germanium substrate and germanium substrate, in addition to the semiconductor substrate of silicon.

The invention as described above is specifically directed to the noted embodiments. However, the present invention is not restricted to the embodiments. One of skill in the art may modify the described embodiments and still practice the invention as claimed below.

What is claimed is:

1. A manufacturing method of a semiconductor device comprising:

forming a gate insulating film on a semiconductor substrate;

depositing an amorphous silicon layer on said gate insulating film;

etching said amorphous silicon layer to form a gate pattern by;

implanting a first impurity of the same conductivity type as a channel region from a diagonal direction into the surface of said semiconductor substrate and into said amorphous silicon layer of said gate pattern;

implanting a second impurity of the conductivity type opposite to that of the channel region at a dose of $1\times10^{14}/cm^2$ to $3\times10^{15}/cm^2$ from a diagonal direction into the surface of said semiconductor substrate and into said amorphous silicon layer of said gate pattern defined after the implanting the first impurity;

covering the gate pattern with an insulating layer under a condition not to crystallize the amorphous silicon layer;

crystallizing the covered gate pattern to convert the amorphous silicon layer of the covered gate pattern to a polycrystal silicon layer with an annealing process;

forming a side wall spacer by etching the insulating layer after said crystallizing and the annealing process; and implanting a third impurity of the conductivity type opposite to that of the channel region into the polycrystal silicon layer.

2. The manufacturing method of a semiconductor device according to claim 1, wherein said implanting of the first impurity is conducted within a range of 7° to 45° wherein a direction perpendicular to the surface of said semiconductor substrate is defined as 0°.

3. The manufacturing method of a semiconductor device according to claim 1, wherein said amorphous silicon layer is an impurity-nondoped amorphous silicon layer.

4. The manufacturing method of a semiconductor device according to claim 3, wherein the metal catalyst is Ni or Fe.

5. The manufacturing method of a semiconductor device according to claim 1 further comprising:

introducing a metal catalyst into said amorphous silicon layer of said gate pattern before the annealing process.

6. The manufacturing method of a semiconductor device according to claim 1, wherein an amorphous layer is formed in said semiconductor substrate by said first impurity during the implanting said first impurity.

7. The manufacturing method of a semiconductor device according to claim 6, wherein said annealing process of said amorphous silicon layer is conducted at a temperature allowing said amorphous layer in said semiconductor substrate to remain amorphous.

8. The manufacturing method of a semiconductor device according to claim 7, wherein said annealing is conducted at a temperature within the range from 450° C. to 550° C.

9. A manufacturing method of a semiconductor device comprising:

forming a gate insulating film on a semiconductor substrate;

depositing an amorphous silicon layer on said gate insulating film;

forming a gate pattern by etching said amorphous silicon layer;

implanting a first impurity into the semiconductor substrate, forming an extension region in the semiconductor substrate using the gate pattern as a mask by implanting a second impurity into the semiconductor substrate after the implanting of the first impurity;

depositing an insulating film covering the entirety of said amorphous silicon layer of said gate pattern and the entirety of the extension region under a condition not to crystallize the amorphous silicon layer;

after depositing the insulating film, crystallizing said amorphous silicon layer of said gate pattern with an annealing process;

forming a side wall spacer on a side wall of said gate pattern by anisotropic etching said insulating film after the annealing process; and implanting a third impurity into the polycrystal silicon layer, wherein crystallizing of the amorphous silicon is conducted in the states that the insulating film covers the entirety of the extension region and the entirety of the amorphous silicon layer of the gate pattern.

* * * * *